US008154349B2

(12) United States Patent
Le Prado et al.

(10) Patent No.: US 8,154,349 B2
(45) Date of Patent: Apr. 10, 2012

(54) ATOMIC CLOCK REGULATED BY A STATIC FIELD AND TWO OSCILLATING FIELDS

(75) Inventors: Matthieu Le Prado, Charmes sur l'Herbasse (FR); Jean-Michel Leger, Villard Bonnot (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 76 days.

(21) Appl. No.: 12/743,433

(22) PCT Filed: Dec. 10, 2008

(86) PCT No.: PCT/EP2008/067252
§ 371 (c)(1), (2), (4) Date: May 18, 2010

(87) PCT Pub. No.: WO2009/074616
PCT Pub. Date: Jun. 18, 2009

(65) Prior Publication Data
US 2010/0244970 A1 Sep. 30, 2010

(30) Foreign Application Priority Data
Dec. 11, 2007 (FR) ..................................... 07 59743

(51) Int. Cl.
*H03L 7/21* (2006.01)

(52) U.S. Cl. .............. 331/3; 331/94.1; 324/301; 368/10

(58) Field of Classification Search ............. 331/3, 94.1; 368/10; 324/301
See application file for complete search history.

(56) References Cited

U.S. PATENT DOCUMENTS

| | | | | |
|---|---|---|---|---|
| 3,284,699 | A | 11/1966 | Malnar | |
| 5,357,199 | A * | 10/1994 | Leger et al. | 324/301 |
| 6,313,628 | B1 | 11/2001 | Leger | |
| 2004/0095037 | A1 | 5/2004 | Palmero | |
| 2004/0202050 | A1 | 10/2004 | Happer et al. | |
| 2005/0212607 | A1 | 9/2005 | Happer et al. | |
| 2007/0247241 | A1 | 10/2007 | Braun et al. | |
| 2009/0066430 | A1 | 3/2009 | Braun et al. | |

FOREIGN PATENT DOCUMENTS

| | | |
|---|---|---|
| EP | 0 964 260 | 12/1999 |
| FR | 1 354 208 | 3/1964 |
| JP | 63 191981 | 8/1988 |

(Continued)

OTHER PUBLICATIONS

Haroche S, et al.,"Modified Zeeman Hyperfine Spectra Observed in H1 and Rb 87 Ground States Interacting With a Nonresonant rf Field" Physical Review Letters, vol. 24, No. 16, p. 861-864, (Apr. 20, 1970).

(Continued)

*Primary Examiner* — Arnold Kinkead
(74) *Attorney, Agent, or Firm* — Oblon, Spivak, McClelland, Maier & Neustadt, L.L.P.

(57) ABSTRACT

An atomic clock including a mechanism applying both a static magnetic field and two oscillating magnetic fields, all mutually perpendicular, in a magnetic shield. The amplitudes and frequencies of the oscillating magnetic fields may be chosen so as to annihilate energy variations between sub-transition levels of excited atoms and to reinforce a clock output signal, and with low sensitivity to defects in regulation.

7 Claims, 2 Drawing Sheets

FOREIGN PATENT DOCUMENTS

WO 2005 081794 9/2005

OTHER PUBLICATIONS

U.S. Appl. No. 12/743,433, filed May 18, 2010, Le Prado, et al.
U.S. Appl. No. 12/747,189, filed Jun. 10, 2010, Le Prado, et al.
U.S. Appl. No. 12/743,433, filed May 18, 2010, Le Prado et al.
Wayne M. Itano, "Atomic Ion Frequency Standards", Proceedings of the IEEE, XP000264852, vol. 79, No. 7, Jul. 1, 1991, pp. 936-941.
D. W. Swallom, et al., An Investigation of the Energy Exchange Mechanisms Involving the $2^3$S Metastable Level in an RF Helium Plasma, Journal of Quantitative Spectroscopy and Radiative Transfer, XP024512623, vol. 14, No. 12, Dec. 1, 1974, pp. 1185-1193.
J. J. Bollinger , et al., "Non-Neutral Ion Plasmas and Crystals, Laser Cooling, and Atomic Clocks", Phys. Plasmas., XP002563571, vol. 1 No. 1, 1994, pp. 1403-1414.
W. Ertmer, et al., "Some Candidate Atoms and Ions for Frequency Standards Research Using Laser Radiative Cooling Techniques", Progress in Quantum Electronics, XP025635622, vol. 8, No. 3-4, Jan. 1, 1984, pp. 249-255.
Preliminary Search Report issued Jan. 15, 2010, in French Patent Application FA 727748.

* cited by examiner

ATOMIC CLOCK REGULATED BY A STATIC FIELD AND TWO OSCILLATING FIELDS

The subject of this invention is an atomic clock regulated or covered by two oscillating fields and a static field that are applied in a shield.

Atomic clocks comprise a gaseous medium, often alkaline, a device for exciting the atoms of this gas such as a laser, capable of making them jump to higher energy states, and a means for measuring a frequential signal emitted by the atoms on returning to the normal energy level, using the photons coming from the laser.

Figure 1:
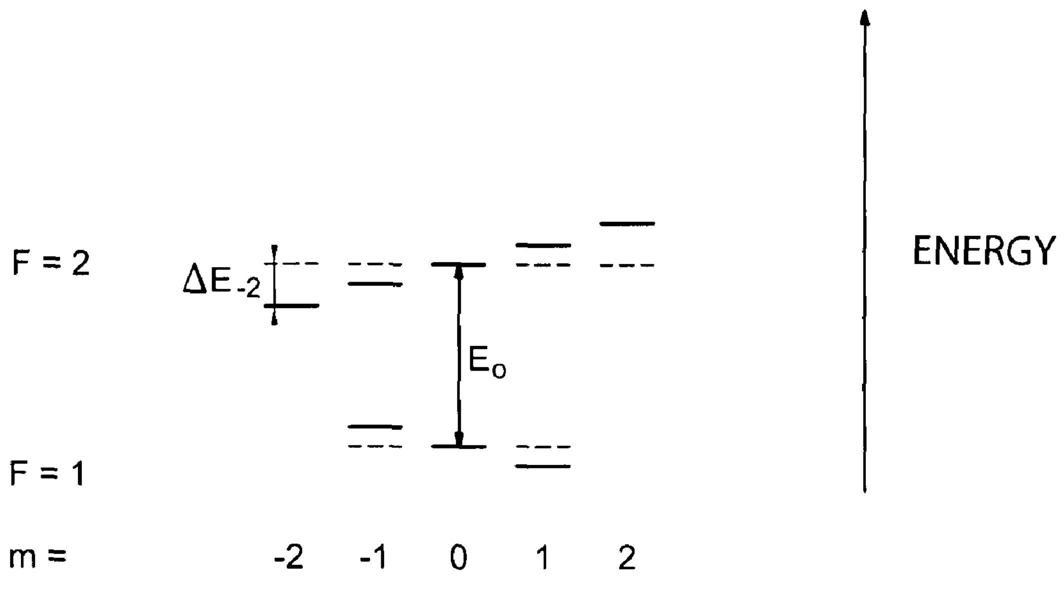

The frequency of the photons returned by the gas is defined by the formula $\nu=\Delta E/h$, where $\nu$ is the frequency, $\Delta E$ the difference between the energy levels and h Planck's constant, equal to $6.63\times10^{-34}$ J.s. It is known that this frequency is very stable and that it can thus serve as time reference unit. This is however no longer true when the Zeeman structure of the material is considered: the energy levels then appear as composed of sub-levels corresponding to slightly different states, which are distinguished by their magnetic quantum number m, 0 for a reference state of the energy level and −1, −2, etc. or +1, +2, etc. for the others. This is illustrated by FIG. 1 in the case of the element $^{87}$ Rb, in which has been shown the breakdown of the first two energy levels (of angular moments F=1 and F=2).

The energy levels are sensitive to the ambient magnetic field. This sensitivity is low (of the second order) for the sub-level at the magnetic number equal to 0, but much greater (of the first order) for the other sub-levels: the transitions made from or up to them produce photons, the frequency of which is variable and thus cannot serve as reference, and only the portion of the signal corresponding to the transition between the two sub-levels of zero magnetic number is exploited for the measurement, which adversely affects its quality. The reference frequency given by the clock is then the hyperfine transition frequency considered in the gas $fo=E_O/h$, where $E_0$ is the energy difference between the sub-levels at m=0 of the two states (F=1 and F=2 in the example of FIG. 1).

One thus resorts to a magnetic shield around the clock to reduce exterior perturbations, and to the application of a constant magnetic field in the shield to properly separate the sub-levels, for want of guaranteeing a zero magnetic field. Although the operation of the clock is made more stable, the sub-levels then being immobile and thus well defined, the drawback of undergoing a dispersion of the frequencies and having to make do with a weakened signal is not avoided.

With the invention, it is endeavoured to improve existing atomic clocks by making them work in zero magnetic field in order to concentrate the sub-levels at a same energy value and to obtain a signal comprising a much sharper measurement peak.

It has been proposed to make the sub-levels with non-zero magnetic number participate in the useful signal by eliminating the dispersion of the energies between sub-levels that the static field causes. The article of Haroche "Modified Zeeman hyperfine spectra observed in $H^1$ and $Rb^{87}$ ground states interacting with a nonresonant RF field", Physical Review Letters, volume 24, number 16, 20 Apr. 1970, pages 861 to 864, discloses that the effect of the static magnetic field may be annihilated for the excited atoms by applying an oscillating field that is perpendicular to it, on condition of respecting the double inequality $$H_0 << \frac{1}{T.\gamma} << \frac{\omega}{\gamma}$$

where $H_0$ is the intensity of the static field, T the relaxation time of the atoms, $\omega$ the pulse of the oscillating field, and $\gamma$ the gyromagnetic moment. The energy differences $\Delta E$ between the sub-levels of a same level then all become zero in each level, the photons returned by the gas all correspond to the energy difference E0, the state of the material of FIG. 2 then being obtained: everything takes place as if a resulting zero field (fictitious) existed.

This implies however respecting the ratios determined between the intensity and the frequency of the oscillating field to obtain this effect; yet a great finesse in regulation is necessary, even a weak perturbation leaving remaining a non-negligible fictitious residual field that prevents benefiting from this discovery.

The invention is based on an improvement, according to which a second oscillating field is added to the device. The invention then comprises a cell filled with a gas, an exciter of the gas to make its atoms jump to a higher energy level, a detector to collect a light signal passing through the gas, a magnetic shield around the cell and means for applying magnetic fields in the shield, including a static magnetic field, characterised in that the means for applying magnetic fields also apply two oscillating magnetic fields, perpendicular to each other and to the static magnetic field.

The addition of the second oscillating magnetic field makes it possible to obtain, with much more reliability, a resulting magnetic field equivalent to a zero magnetic field for the excited atoms, in other words with a much lower sensitivity to perturbations.

It is advantageous that the clock comprises means for regulating either the intensity or the frequency of the oscillating magnetic fields.

The invention will now be described in referring to the figures, of which

FIG. 1 already described and

Figure 2:
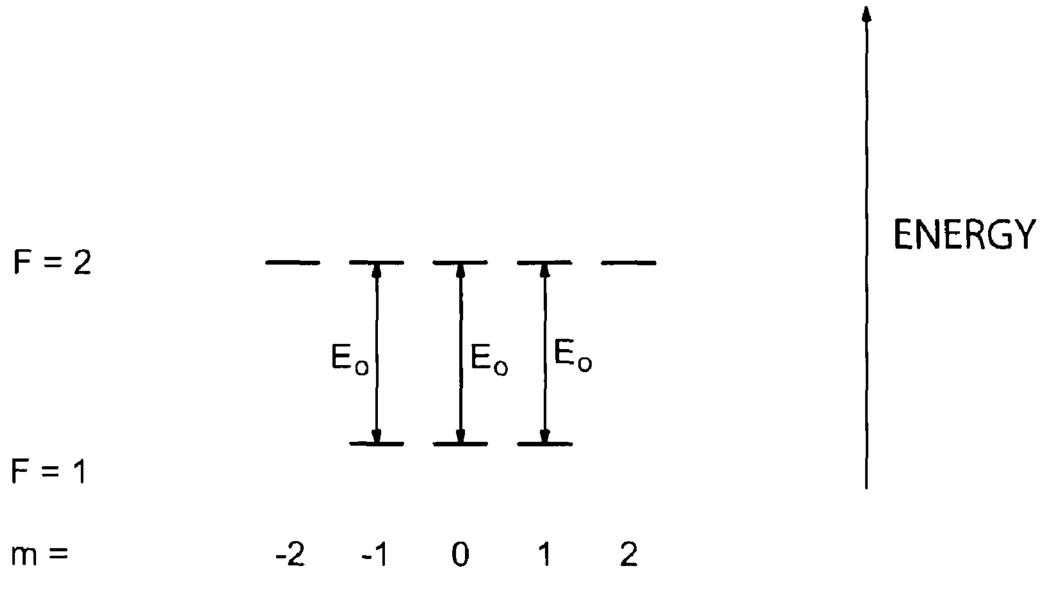
Figure 3:
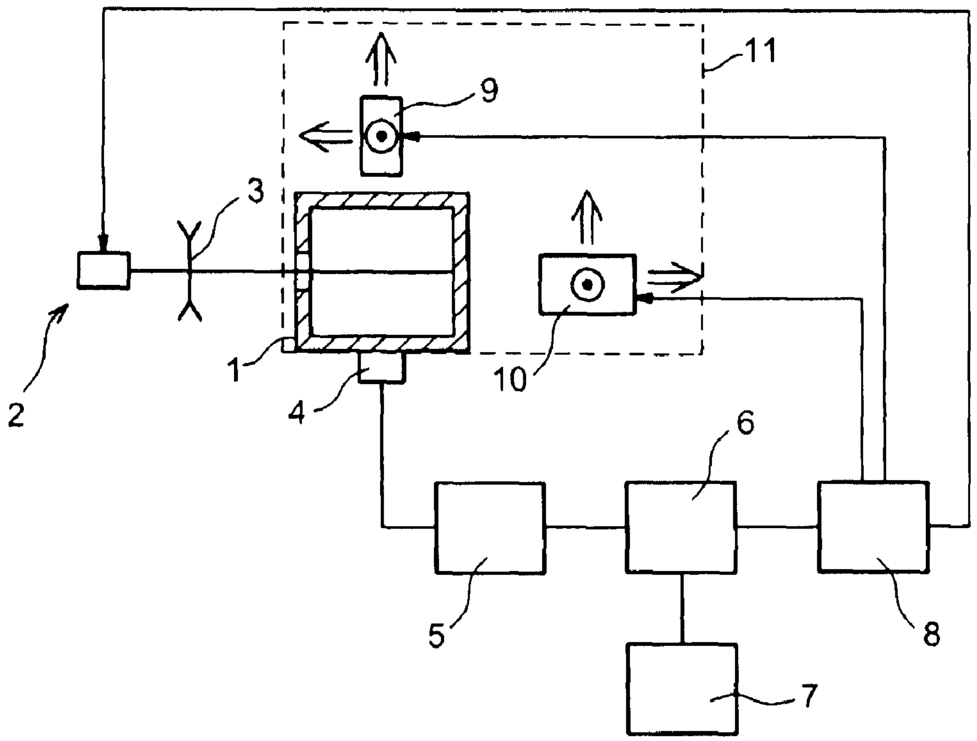
Figure 4:
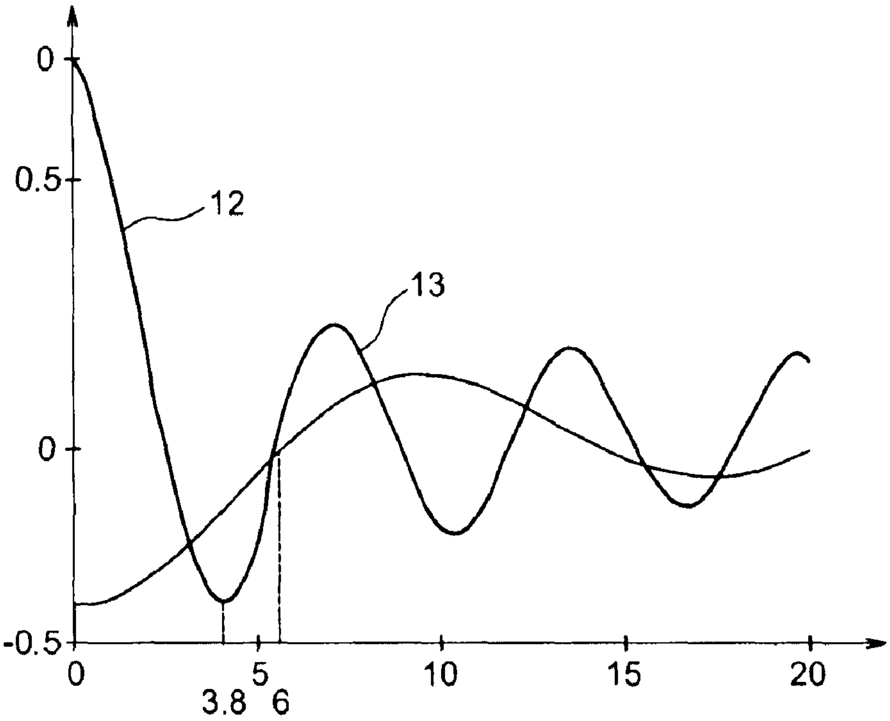

FIG. 2 already described illustrate two diagrams of the energy levels of a chemical element used in an atomic clock, FIG. 3 is a schematic view of the clock, and FIG. 4 is a graphic representation of functions illustrating the effect of the invention.

Reference is made to FIG. 3. The core of the clock is a cell 1 filled with an alkaline gas. An exciter 2 transmits energy to this gas in the form of a flux of polarised photons passing through a circular polariser 3. The exciter may also be a field of microwaves for example. It will then be necessary in any case to inject a light beam (for example a laser) to detect the resonances of the gas. A photodetector 4 collects the luminous energy returned by the gas of the cell 1 and transmits a signal to a counting device 5. A frequency separator 6 collects the signal at the output of the counting device 5 and transmits its results to an operating device 7 of the clock and a control device 8, which governs the exciter 2 as well as means for applying magnetic fields 9 and 10. The latter emit magnetic fields at radiofrequencies of pulsations noted $\Omega$ and $\omega$, which are mutually perpendicular and of direction dependent on the polarisation (for example perpendicular to the light rays emitted by the exciter 2 in the case of a circular polarisation). These oscillating magnetic fields are applied in a magnetic shield 11 that encompasses the cell 1 and the means for applying magnetic fields 9 and 10.

We will now return to the theoretical explanation of the phenomena. The combination of a static magnetic field of intensity $H_0$ and a radiofrequency field of intensity $H_\omega$ and pulsation $\omega$ meeting the conditions indicated above has an equivalent effect on the atoms to that of a fictitious static magnetic field of intensity $H_0'$ the components of which are equal to $H_0 \cdot \cos\alpha$ and $H_0 \cdot J_0(\gamma H_\omega/\omega) \cdot \sin\alpha$ respectively in the direction of the radiofrequency field and the direction perpendicular to said field, $J_0$ being a Bessel function of the first kind and $\alpha$ being the angle between the static field and the radiofrequency field. When the fields are mutually perpendicular, the first component disappears and $H_0'=H_0 \cdot J_0(\gamma H_\omega/\omega)$. However the Bessel function $J_0$ of the first kind is between −1 and +1 and cancels itself out in at least one point. A graphic representation of this is given in FIG. 4 (curve 12). Judicious choices of the ratio $\gamma H_\omega/\omega$ thus make it possible to cancel the resulting fictitious magnetic field $H_0'=0$; one of these ratios is equal to 2.4. It may nevertheless be seen that the slope of the function is important, and that a 10% variation in the regulation produces a resulting magnetic field, the intensity of which is around 0.1 $H_0$, which is excessive. This is why the second oscillating field is added. It is orthogonal to the first radiofrequency field and to the static field, its pulsation is $\Omega$ and its intensity is $H_\Omega$. The pulsation $\Omega$ meets the following inequalities $$H_0 << \frac{1}{T\cdot\gamma} << \frac{\Omega}{\gamma} << \frac{\omega}{\gamma},$$

in other words that the second radiofrequency field has the same effects as the first on the static field but that its pulsation is much less than that of the first radiofrequency field. In addition, it should be noted that the frequencies of the two oscillating fields must not be too high: it is necessary that they do not exceed around (fo/4), where fo already mentioned is the hyperfine transition frequency and corresponding to the change of energy level of the atoms in the gas. The first oscillating magnetic field also then undergoes modifications that results in an attenuation of its amplitude $H_\Omega$ by the Bessel function. The system composed of the two fields of radiofrequencies and the static magnetic field is thus equivalent to a fictitious radiofrequency field $H_\Omega \cdot J_0(\gamma H_\omega/\omega) \cdot \cos(\Omega t)$ and a fictitious static field $H_0'=H_0 \cdot J_0(\gamma H_\omega/\omega)$, and this system is itself equivalent, according to the preceding, to a fictitious static field $H_0''$ attenuated by the contribution of the two radiofrequency fields, of intensity $$H_0'' = H_0' J_0\left(\frac{\gamma H_\Omega \cdot J_0(\gamma H_\omega/\omega)}{\Omega}\right) = H_0 J_0(\gamma H_\omega/\omega) J_0\left(\frac{\gamma H_\Omega \cdot J_0(\gamma H_\omega/\omega)}{\Omega}\right).$$

This field can be cancelled out by particular regulations of each of the radiofrequency fields. FIG. 4 shows an example of evolution of the ratio $H_0'/H_0''$ as a function of $\gamma H_\Omega/\Omega$ (curve 13): $H_0''$ is cancelled out a first time for a ratio $\gamma H_\Omega/\Omega=6.0$. This value depends on that of $J_0(\gamma H\omega/\omega)$, which, in the present case, has been chosen at 3.8, in other words an extremum of the Bessel function of the curve 12. By placing oneself in this way, the sensitivity of $H_0''$ to variations of $(\gamma H\omega/\omega)$ is eliminated, which stabilises its regulation. The sensitivity of $H_0''$ to the variations of $\gamma H_\Omega/\Omega$ remains nevertheless of the first order, but it is significantly attenuated compared to what is obtained with a single radiofrequency field, as the comparison of curves 12 and 13 shows, since the slope at the intersects of the axis of the abscissa (at the zero ordinates) is reduced by a factor that may be demonstrated equal to $[J_0(\gamma H_\omega/\omega)]^2$. A 10% variation of $\gamma H\Omega/\Omega$ around the value of 6.0 induces a fictitious field $H_0''=(J_0(3.8))^2\times 0.1\times H_0''=0.016H_0''$ instead of 0.1 $H_0$ with a single radiofrequency field: the sensitivity to defects in regulation is reduced by 84%. Furthermore, $J_0(\gamma H_\omega/\omega)$ being at an extremum, $H_0''$ is not sensitive to variations in this ratio around this point of regulation. It would obviously be possible to place the ratio $\gamma H_\omega/\omega$ at other extrema of the Bessel function, which would have given an even lower sensitivity to defects in regulation.

The experimental regulations may differ slightly from the theoretical regulations. It is possible to perform them by exploiting an information given by a sinusoidal magnetic field at low frequency $\upsilon$ (well below ½ $\pi$T) and co-linear to $H_0$. This field induces perturbations in the signal delivered by the clock at the frequencies fo±$\upsilon$. It is then possible to quantify the sensitivity of the signal delivered by the atomic clock to variations of the static magnetic field by a synchronous detection at the frequency of this perturbation. An interesting operating point could be obtained by regulating firstly the amplitude $H_\omega$ of the field at the highest frequency ($\omega/2\pi$) to a maximum of sensitivity of the static field $H_0$. The other radiofrequency field $H_\Omega$ will then be added and adjusted to obtain a minimum sensitivity of $H_0$.

The control device 8 may serve as a continuous regulation of the amplitude of the second radiofrequency field as a function of this principle of conserving a minimum sensitivity of the signal delivered by the clock.

The unique exciter may be a flux of photons such as a laser flux emitted for example by a diode laser or a lamp. The gaseous element may consist of $^{87}$Rb, $^{133}C_s$, with mixing if necessary with a buffer gas. The material of the cell 1 may consist of a glass such as Pyrex™. The means for applying magnetic fields 9 and 10 may consist of triaxial coils, or of three mutually concentric monoaxial coils. The photodetector 4 may be of any type measuring a flux of photons at the output of the cell 1. These photons have to be polarised for example by polarisers added to the exciter. The control is accomplished by any known materiel comprising a computing unit. The coils are current controlled. The excitation at the resonance frequency is accomplished by an amplitude modulation of the diode laser at the frequency $f_0/2$, or by a microwave cavity resonating at the frequency $f_0$. An exciter comprising two lasers, the frequency difference of which is $f_0$, may also be envisaged.

The shield then being particularly efficient, all of the sub-levels become equivalent since the field is zero. Other gases than those normally employed in atomic clocks (alkali gases) may then be used, in particular gases in which the hyperfine structure of their atoms does not have sub-levels with zero angular momentum, such as $^3$He.

The magnetic shield 11 may consist of overlapping cylinders of $\mu$ metal, with if necessary a cylinder of soft iron. In a particular case where the element $^{87}$Rb was employed, the wavelength of the photons of the laser was 780 nm, a quarter wave plate imposed a left circular polarisation to the incident photons, the magnetic shield 11 consisted in four concentric cylinders of $\mu$ metal and a cylinder of soft iron on the outside, the magnetic field $H_0$ was 100 microgauss in the principal axis, $\gamma$ was equal to 670 kilohertz per gauss, and the radiofrequencies were 3 kilohertz and 20 kilohertz at respective amplitudes of 27 and 114 milligauss in order to impose the conditions previously identified of validity of the method.

The invention claimed is:

1. An atomic clock comprising:

a cell filled with a gas;

an exciter of the gas to make its atoms jump to a higher energy level;

a detector to collect a light signal passing through the gas;

a magnetic shield around the cell; and means for applying magnetic fields, including a static magnetic field, wherein the means for applying magnetic fields also applies two oscillating magnetic fields, perpendicular to each other and to the static magnetic field, such that a Bessel function of a first kind of a ratio $\gamma H_{106}/\Omega$, in which $H_\Omega$ and $\Omega$ are an intensity and a frequency of one of the oscillating magnetic fields, which has a lower frequency than the other, and $\Omega$ is a gyromagnetic ratio, is equal to 0.

2. An atomic clock according to claim 1, further comprising means for regulating either intensity or frequency of the oscillating magnetic fields.

3. An atomic clock according to claim 1, wherein the Bessel function of the first kind of a ratio $\gamma H_\Omega/\Omega$, in which $H_\omega$ and $\omega$ are an intensity and a frequency of the other of the oscillating magnetic fields, and $\gamma$ is a gyromagnetic ratio, is at an extremum.

4. An atomic clock according to claim 1, wherein the means for applying magnetic fields comprises at least three concentric monoaxial coils.

5. An atomic clock according to claim 1, wherein the means for applying magnetic fields comprises at least one triaxial magnetic coil.

6. An atomic clock according to claim 1, wherein the gas is chosen among alkali gases and helium 3.

7. An atomic clock according to claim 1, wherein the oscillating magnetic fields have frequencies at most equal to a quarter of a hyperfine transition frequency measured by the clock.

* * * * *